United States Patent
Sudo

(10) Patent No.: US 7,402,885 B2
(45) Date of Patent: Jul. 22, 2008

(54) LOCOS ON SOI AND HOT SEMICONDUCTOR DEVICE AND METHOD FOR MANUFACTURING

(75) Inventor: Gaku Sudo, Yokohama (JP)

(73) Assignee: Toshiba America Electronic Components, Inc., Irvine, CA (US)

( * ) Notice: Subject to any disclaimer, the term of this patent is extended or adjusted under 35 U.S.C. 154(b) by 15 days.

(21) Appl. No.: 11/433,583

(22) Filed: May 15, 2006

(65) Prior Publication Data

US 2007/0262392 A1    Nov. 15, 2007

(51) Int. Cl.
*H01L 29/207* (2006.01)

(52) U.S. Cl. .............. 257/509; 257/351; 257/510; 257/547; 257/E21.545; 257/E21.54

(58) Field of Classification Search .............. None
See application file for complete search history.

(56) References Cited

U.S. PATENT DOCUMENTS 5,841,170 A * 11/1998 Adan et al. .............. 257/345
6,462,379 B2 * 10/2002 Higashi et al. .............. 257/347
6,602,613 B1 * 8/2003 Fitzgerald .............. 428/641

* cited by examiner

*Primary Examiner*—A. Sefer
*Assistant Examiner*—Scott R Wilson
(74) *Attorney, Agent, or Firm*—Banner & Witcoff, Ltd.

(57) ABSTRACT

One or more local oxidation of silicon (LOCOS) regions may be formed that apply compressive strain to a channel of a field-effect transistor such as a P-type field-effect transistor (PFET) or other circuit element of a semiconductor device. For instance, a pair of LOCOS regions may be formed on opposite sides of a PFET gate and its corresponding channel, or one or more LOCOS regions may more fully surround, or even completely surround, the PFET channel. In addition, one or more slits may be formed in the LOCOS regions as appropriate to reduce or even completely neutralize the compressive strain in certain directions that would otherwise be applied without the slits. These techniques may be used in silicon-on-insulator (SOI) wafers with or without hybrid orientation technology (HOT) regions.

16 Claims, 6 Drawing Sheets

LOCOS ON SOI AND HOT SEMICONDUCTOR DEVICE AND METHOD FOR MANUFACTURING

BACKGROUND

Field-effect transistors (FETs) in semiconductor devices are often manufactured such that either a compressive strain or a tensile strain is applied to the FET channels. This strain, if applied in appropriate directions, can enhance FET performance. N-type FETs (NFETs) can be enhanced through appropriately directed tensile strain, whereas P-type FETs (PFETs) can be enhanced through appropriately directed compressive strain.

Conventionally, strain is produced either by embedding stress-inducing materials, such as silicon-germanium, into the silicon on opposing sides of the FET channel, or by forming a strain-inducing layer over the FET, such as a doped silicon nitride layer. Although these techniques can be used to apply either tensile or compressive strain on a FET channel, there are practical limits to the amount of strain that can be applied using these techniques.

Moreover, the strain supplied by these techniques is not always directed as efficiently as desirable to the FET channel. The strain is often diluted, canceled out, and/or dispersed to other regions of the semiconductor device.

In addition, these techniques do not always work well and can be expensive to implement in mixed-technology semiconductor devices, such as those that contain both silicon-on-oxide (SOI) regions and hybrid orientation technology (HOT) regions.

SUMMARY

Aspects of the present disclosure are directed to using one or more local oxidation of silicon (LOCOS) regions to apply compressive strain to channels of P-type field-effect transistors (PFETs). However, LOCOS may alternatively be used to apply compressive strain to other circuit elements, as desired, such as but not limited to, N-type FETs. In some embodiments, a pair of LOCOS regions are formed on opposite sides of a PFET gate and its corresponding channel. In other embodiments, one or more LOCOS regions may more fully surround, or even completely surround, the PFET gate and channel. One or more slits may be formed in the LOCOS regions as appropriate to reduce or even completely neutralize the compressive strain in certain directions that would otherwise be applied without the slits.

Further aspects of the present disclosure are directed to using LOCOS regions to not only apply compressive strain, but also to electrically isolate a FET active area. This is especially practical when used on a silicon-on-insulator (SOI) wafer or region of a wafer, since the LOCOS regions may fully extend down to and physically contact the buried oxide (BOX) layer of the SOI wafer. In addition, if used, shallow trench isolation (STI) layers may help electrically isolate the FET active area. For instance, where a pair of LOCOS regions are disposed on first and second opposing sides of a FET channel, then STI layers may also be disposed on third and fourth opposing sides, perpendicular to the first and second sides, of the FET channel.

Still further aspects of the present disclosure are directed to using LOCOS to electrically isolate FET active areas and/or apply compressive strain to FET channels in pure SOI semiconductor devices as well as in SOI semiconductor devices that also incorporate hybrid orientation technology (HOT) bulk silicon regions.

These and other aspects of the disclosure will be apparent upon consideration of the following detailed description of illustrative embodiments.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein.

DETAILED DESCRIPTION OF ILLUSTRATIVE EMBODIMENTS

Figure 1:
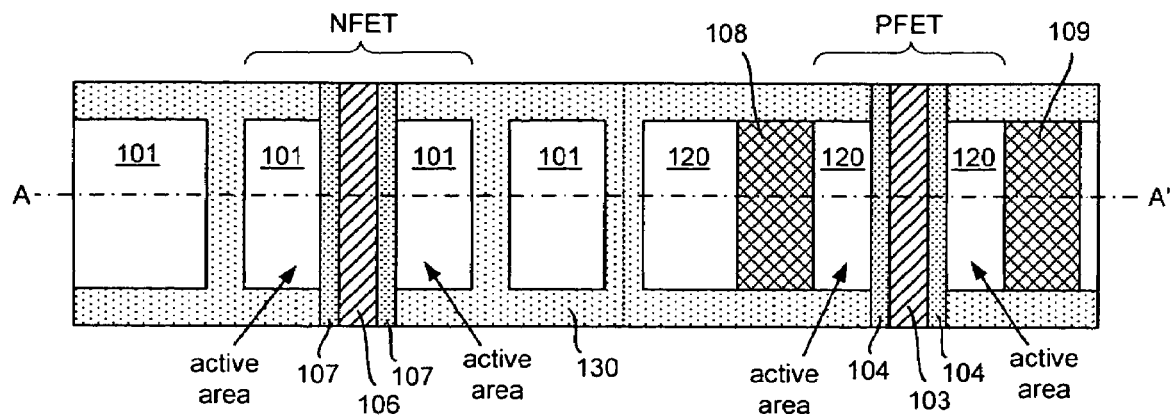
FIG. 1 is a plan view of an illustrative semiconductor device using both LOCOS and STI to isolate a PFET.
Figure 2:
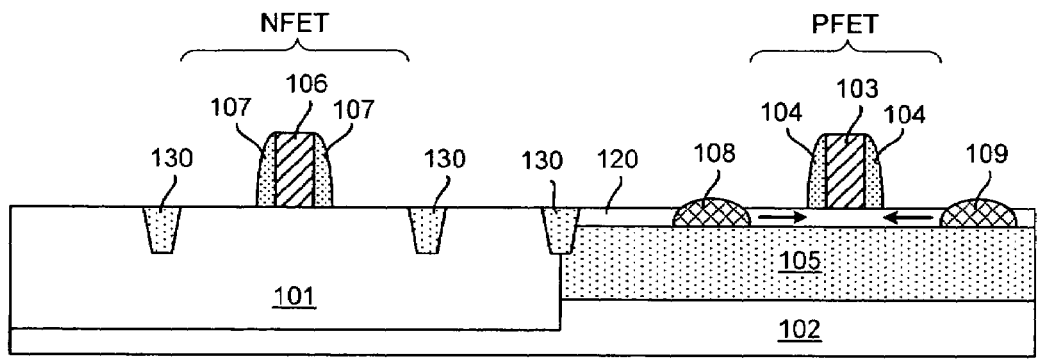
FIG. 2 is a side cutaway view of the semiconductor device of FIG. 1, taken along view A-A' of FIG. 1.

FIG. 1 is an overhead plan view, and FIG. 2 is a side cutaway view taken along view A-A', of a semiconductor device including an N-type field-effect transistor (N-type FET, or NFET) and a P-type FET (PFET). As is conventional, the NFET includes a conductive gate 106 such as polysilicon) and insulating sidewall spacers 107 disposed on opposing sidewalls of gate 106, and the PFET also includes a conductive gate 103 (such as polysilicon) and insulating sidewall spacers 104 disposed on opposing sidewalls of gate 103. The NFET and PFET each have channels disposed directly underneath, and controlled by, their respective gates 106, 103. The NFET channel is disposed in a silicon layer 101, and the PFET channel is disposed in a silicon layer 120.

Silicon layer 101 is considered a bulk silicon layer, whereas silicon layer 120 is considered a silicon-on-insulator (SOI) layer, in that silicon layer 120 is disposed on an insulating layer 105, such as a buried oxide (BOX) layer, which is further disposed on another silicon layer 102. One or more additional layers (not shown) may further be disposed underneath silicon layers 101 and 102. Also, one or more additional layers (not shown) may further be disposed on silicon layer 101 and 120, such as a silicon nitride (SiN) layer and/or an inter-layer dielectric (ILD).

As is the configuration in the present example, it is sometimes desirable to locate one type of FET in a bulk region and another type of FET in an SOI region on the same semiconductor device. This may be done by performing what has been recently known as the hybrid orientation technology (HOT) process. A simple explanation of the HOT process is that an SOI wafer is provided and a bulk silicon region is grown in a trench formed in the SOI wafer. This allows the silicon in the bulk region to have a crystalline orientation different from the crystalline orientation of the upper silicon layer in the SOI wafer. Applying this concept to the present example, this means that silicon layer 101 may have a crystalline orientation different from the crystalline orientation of silicon layer 120. This difference in crystalline orientation may be desirable for various reasons including increasing electron or hole mobility, as appropriate, for different types of FETs in the same semiconductor wafer.

The NFET and PFET are electrically isolated from each other, and from other electrical elements, within their respective silicon layers. In other words, it is desirable to prevent stray current from flowing into and out from the NFET and the PFET via silicon layers 101 and 120. Conventionally, to accomplish this, an insulating shallow-trench isolation (STI) layer is embedded in the underlying silicon, completely surrounding the active area of the FET. In the present example, this is done for the NFET by embedding STI layer 130 in silicon layer 101.

In addition, it is desirable to provide compressive strain on the channel of a PFET. As discussed earlier, such compressive strain may enhance the performance of a PFET. It has been discovered that both the isolation and compression functions may be successfully performed in an SOI wafer by a single structure known as a local oxidation of silicon region, or LOCOS region. In the present example, two LOCOS regions 108 and 109 are formed in silicon region 120 on two opposing sides of PFET gate 103 and bordering the PFET active area.

LOCOS regions are compressive. When silicon is oxidized, the volume of the oxidized silicon increases. Thus, by oxidizing a region of existing silicon, the oxidized silicon (i.e., the LOCOS region) tries to expand in all directions. Because the LOCOS region is unable to fully expand laterally, a compressive strain is produced by the LOCOS region. When LOCOS regions are disposed on opposing sides of a gate (and thus on opposing sides of a channel), the cumulative compressive strain is applied to the channel. This applied compressive strain is indicated in FIG. 2 by arrows pointing towards the channel of the PFET.

LOCOS regions are also insulative. That is, they do not substantially allow current to flow through them. In the present case, LOCOS regions 108 and 109 extend fully downward to, and physically contact, insulating layer 105, thereby forming a solid insulating barrier between the PFET active area and the portion of silicon layer 120 on the opposite side of each LOCOS region 108, 109. Thus, as shown in FIG. 1, the PFET active area is completely surrounded and isolated by a combination of STI layer 130 and LOCOS regions 108, 109.

Figure 3:
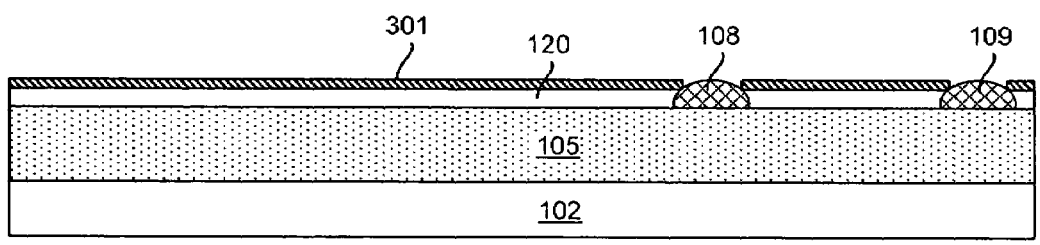
FIG. 3 is a side cutaway view showing an illustrative step during manufacturing of an SOI semiconductor device wherein LOCOS regions are formed prior to STI formation.
Figure 4:
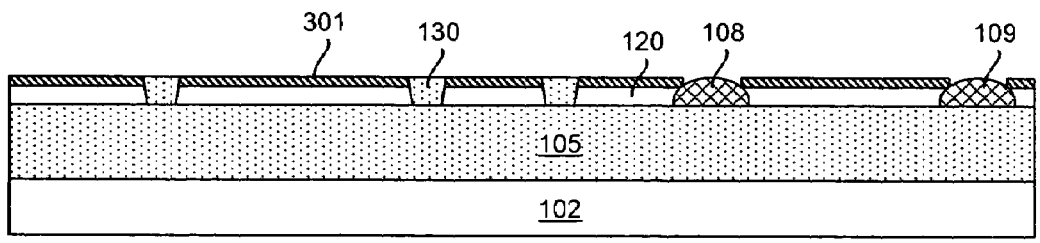
FIG. 4 is a side cutaway view showing an illustrative step during manufacturing of an SOI semiconductor device wherein LOCOS regions are formed after STI formation but before FET gate formation.
Figure 5:
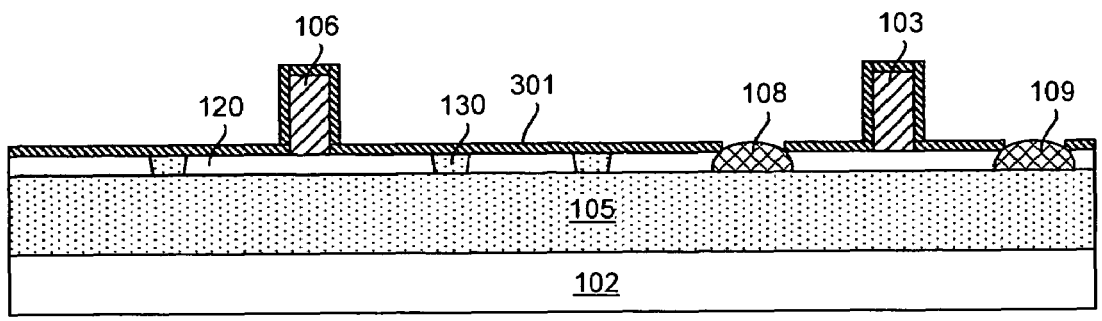
FIG. 5 is a side cutaway view showing an illustrative step during manufacturing of an SOI semiconductor device wherein LOCOS regions are formed after FET gate formation but before gate spacer formation.
Figure 6:
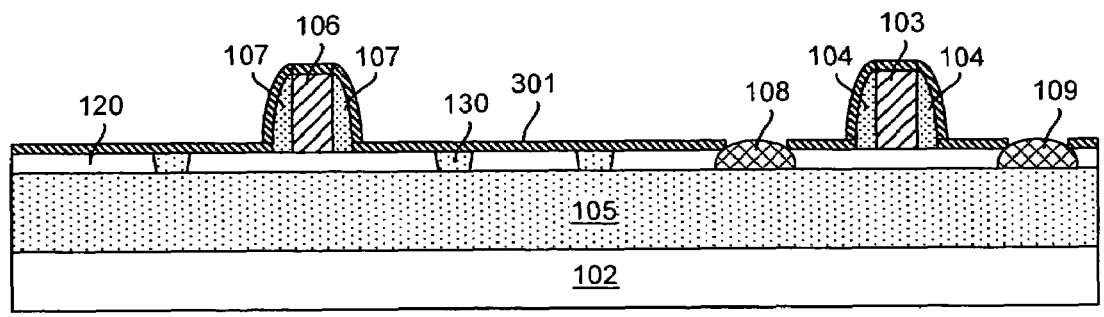
FIG. 6 is a side cutaway view showing an illustrative step during manufacturing of an SOI semiconductor device wherein LOCOS regions are formed after FET gate spacer formation.

LOCOS regions 108 and 109 may be formed during various stages of manufacturing an SOI semiconductor device. For instance, as illustrated by FIG. 3, LOCOS regions 108 and 109 may be formed prior to formation of STI layer 130. In FIG. 3, layer 301 is a hard mask such as silicon nitride (SiN). Or, as illustrated by FIG. 4, LOCOS regions 108 and 109 may be formed after formation of STI layer 130 but before formation of gates 103 and 106. Or, as illustrated by FIG. 5, LOCOS regions 108 and 109 may be formed after formation of gates 103 and 106 but prior to formation of gate sidewall spacers 104 and 107. Or, as illustrated by FIG. 6, LOCOS regions 108 and 109 may be formed after formation of gate sidewall spacers 104 and 107.

Figure 7:
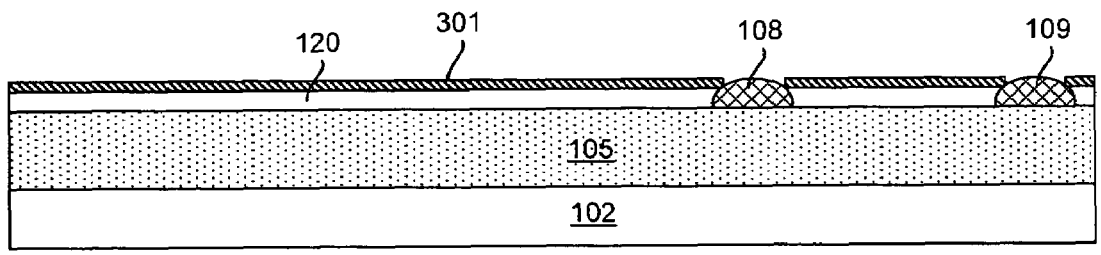
FIG. 7 is a side cutaway view showing an illustrative step during manufacturing of an SOI/HOT semiconductor device wherein LOCOS regions are formed prior to HOT bulk silicon formation.
Figure 8:
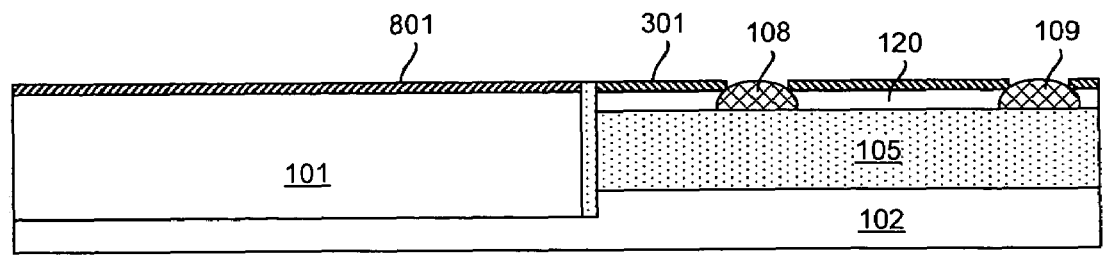
FIG. 8 is a side cutaway view showing an illustrative step during manufacturing of an SOI/HOT semiconductor device wherein LOCOS regions are formed during HOT bulk silicon formation.
Figure 9:
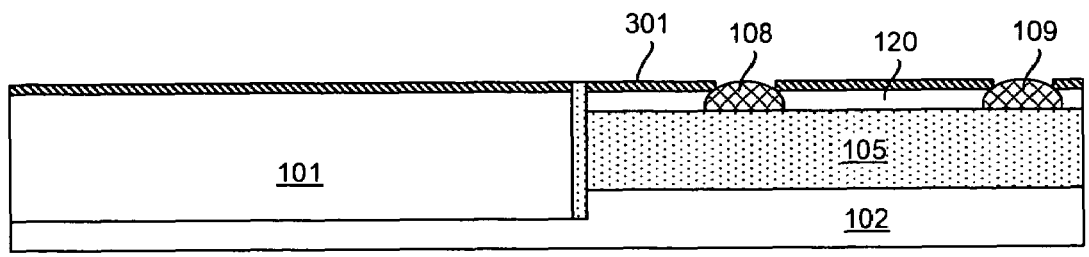
FIG. 9 is a side cutaway view showing an illustrative step during manufacturing of an SOI/HOT semiconductor device wherein LOCOS regions are formed after HOT bulk silicon formation but before STI formation.
Figure 10:
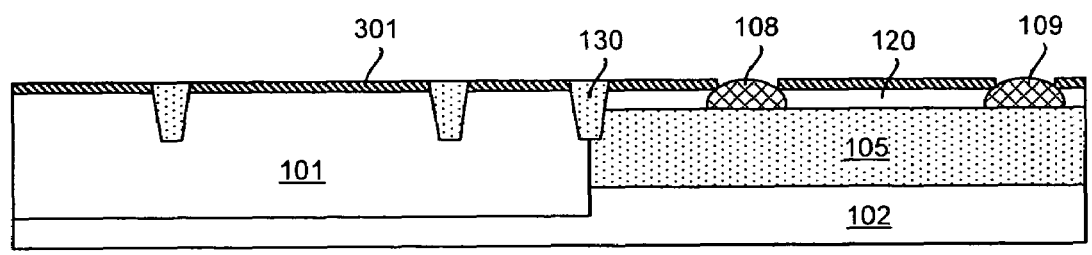
FIG. 10 is a side cutaway view showing an illustrative step during manufacturing of an SOI/HOT semiconductor device wherein LOCOS regions are formed after STI formation but before FET gate formation.
Figure 11:
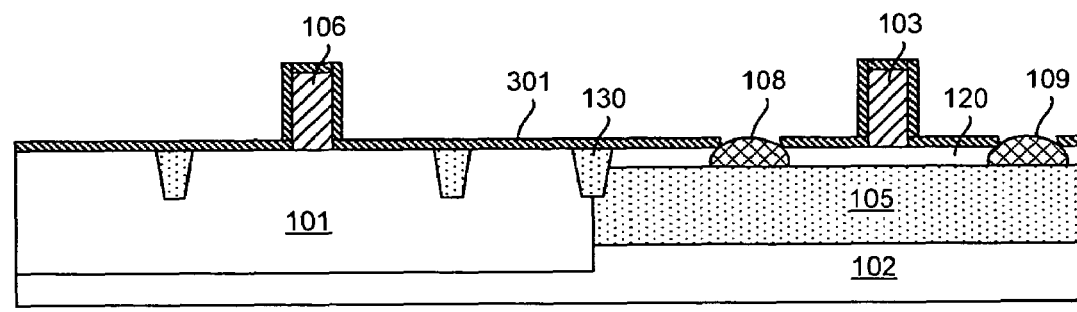
FIG. 11 is a side cutaway view showing an illustrative step during manufacturing of an SOI/HOT semiconductor device wherein LOCOS regions are formed after FET gate formation but before gate spacer formation.
Figure 12:
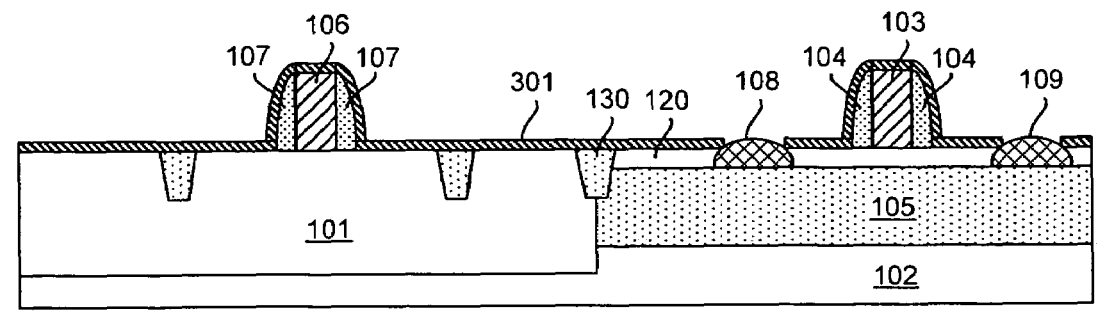
FIG. 12 is a side cutaway view showing an illustrative step during manufacturing of an SOI/HOT semiconductor device wherein LOCOS regions are formed after gate spacer formation.

Also, LOCOS regions 108 and 109 may be formed during various stages of manufacturing a combined SOI/HOT semiconductor device. For instance, as illustrated by FIG. 7, LOCOS regions 108 and 109 may be formed prior to HOT region formation. Or, as illustrated by FIG. 8, LOCOS regions 108 and 109 may be formed during HOT region formation. In FIG. 8, layer 801 is oxidized silicon that is formed as part of the conventional HOT process. Or, as illustrated by FIG. 9, LOCOS regions 108 and 109 may be formed after HOT region formation but prior to formation of STI layer 130. Or, as illustrated by FIG. 10, LOCOS regions 108 and 109 may be formed after formation of STI layer 130 but prior to formation of gates 103 and 106. Or, as illustrated by FIG. 11, LOCOS regions 108 and 109 may be formed after formation of gates 103 and 106 but prior to formation of gate sidewall spacers 104 and 107. Or, as illustrated by FIG. 12, LOCOS regions 108 and 109 may be formed after formation of gate sidewall spacers 104 and 107.

Figure 13:
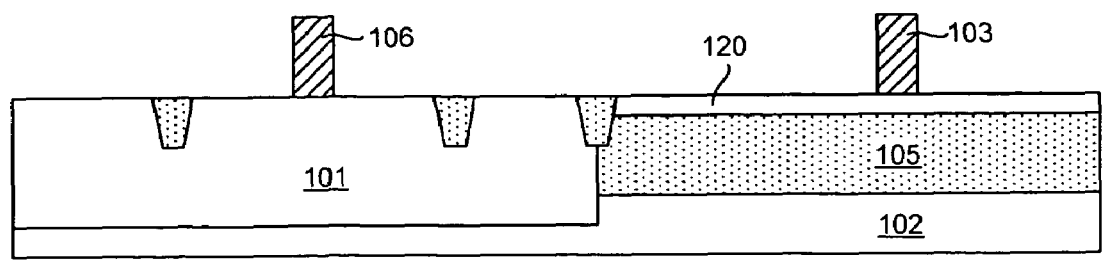
FIGS. 13-16 are side cutaway views showing illustrative steps during manufacturing of the semiconductor device of FIG. 11.
Figure 14:
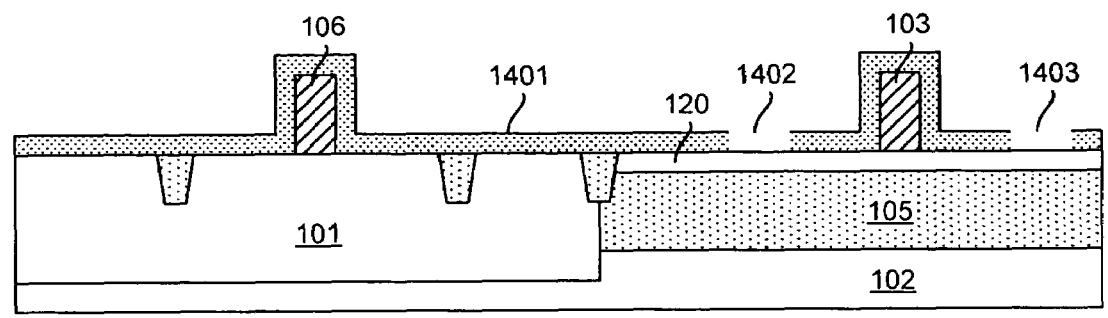
Figure 15:
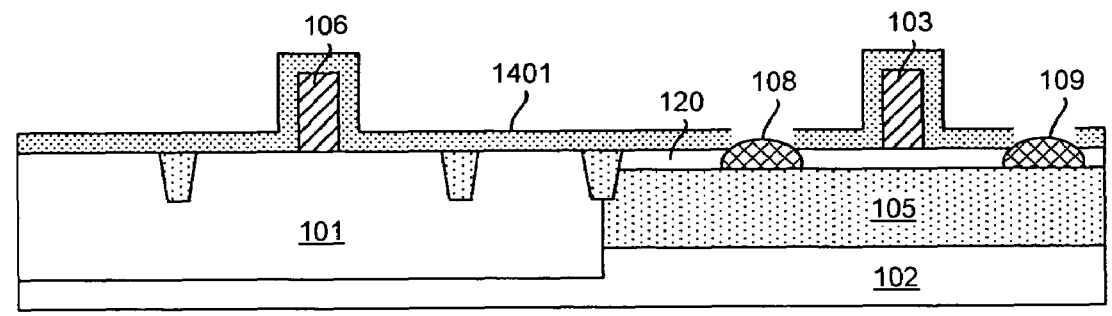
Figure 16:
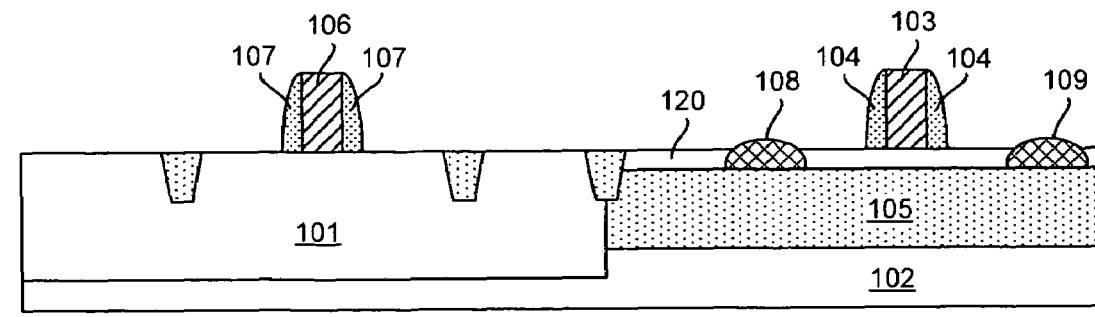

An example of various steps in a manufacturing process consistent with FIG. 11 is now described with regard to FIGS. 13-16. As shown in FIG. 13, gates 103 and 106 are formed using conventional gate formation processes such as using lithographic techniques including a photo-resist patterned mask. Gates 103 and 106 may be made of a conductive material, such as polysilicon. Next, as shown in FIG. 14, a hard mask layer 1401, such as SiN, is deposited over the wafer including gates 103 and 106. Hard mask layer 1401 is then patterned by lithographic techniques to form openings 1402 and 1403. As shown in FIG. 15, these openings 1402 and 1403 are where LOCOS regions 108 and 109 are formed. To form LOCOS regions 108 and 109, oxidation is performed such that the portions of silicon layer 120 exposed by openings 1402 and 1403 are oxidized, whereas those portions of silicon layer 120 covered by hard mask layer 1401 are protected from the oxidation step. Then, hard mask layer 1401 is etched by an-isotropic RIE to form spacers 107 and 104, resulting in the structure shown in FIG. 16.

Figure 17:
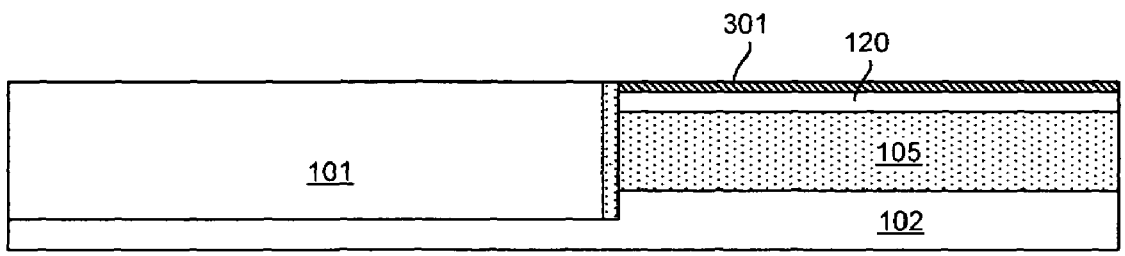
FIGS. 17-19 are side cutaway views showing illustrative steps during manufacturing of the semiconductor device of FIG. 8.
Figure 18:
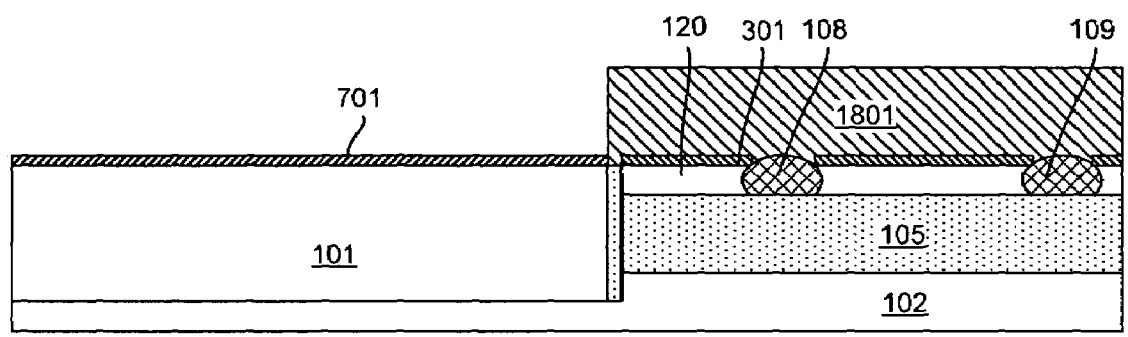
Figure 19:
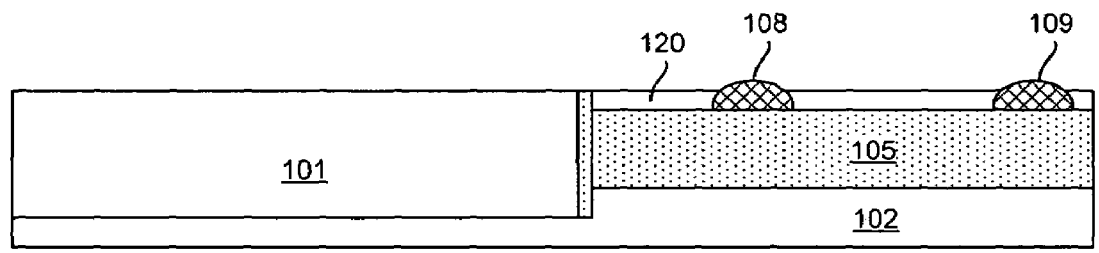

Another example of various steps in a manufacturing process, consistent with FIG. 8, is now described with regard to FIGS. 17-19. A HOT region is formed by creating a trench in the SOI wafer extending down to, in this example, silicon layer 102. Then, the trench sidewalls are lined with an insulating spacer such as oxide, and silicon is epitaxially grown on the exposed portion of silicon layer 102 at the bottom of the trench to form silicon layer 101. The silicon layer 101 fills and even overflows out of the trench. Then, chemical-mechanical polishing (CMP) is performed on the excess silicon layer 101 that extends above the trench to bring the upper level of silicon layer 101 to be substantially co-planar with the upper surface of hard mask layer 301. The result of the CMP step is shown in FIG. 17.

Next, referring to FIG. 18, openings are made in hard mask layer 301 and LOCOS regions 108 and 109 are formed by oxidizing those portions of silicon layer 120 exposed by the openings. In addition, the upper portion of silicon layer 101 is oxidized to result in a silicon oxide layer 701. Then, a photo-resist layer 1801 is formed over the semiconductor device and using lithographic techniques is patterned so as not to cover silicon oxide layer 701. Next, silicon oxide layer 701 is removed by wet etching. Then, photo-resist layer 1801 and hard mask 301 are removed. The result is that the upper surface of silicon layer 101 is substantially coplanar with the upper surface of silicon layer 120, as shown in FIG. 19.

In the examples discussed thus far, LOCOS regions are disposed only on two opposing sides of a PFET gate. However, variations may be implemented where LOCOS regions are disposed on more than two sides of the PFET gate, and where LOCOS regions may even completely surround the PFET gate.

Figure 20:
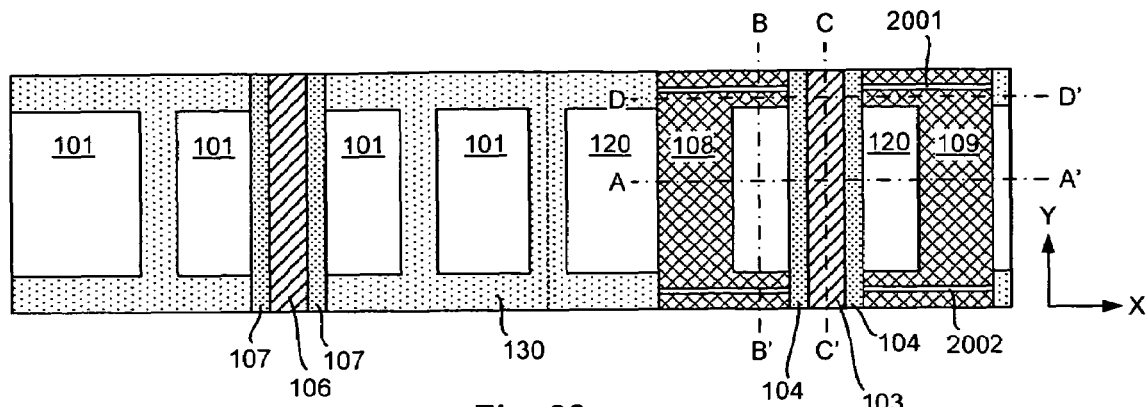
FIG. 20 is a plan view of an illustrative semiconductor device wherein a LOCOS region surrounds a PFET and is modified by slits to reduce undesirable strain.
Figure 21:
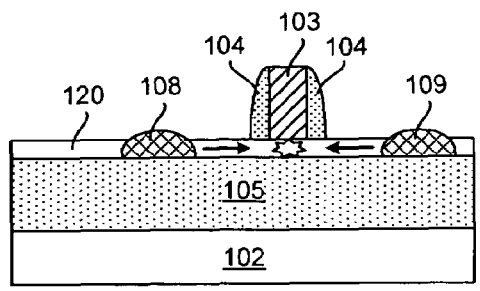
FIG. 21 is a side cutaway view of the semiconductor device of FIG. 20, taken along view A-A' of FIG. 20.
Figure 22:
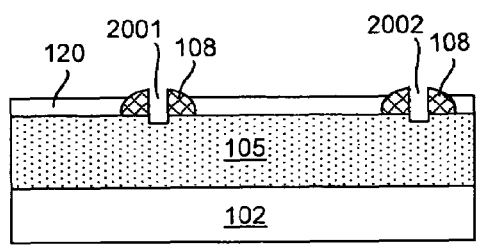
FIG. 22 is a side cutaway view of the semiconductor device of FIG. 20, taken along view B-B' of FIG. 20.
Figure 23:
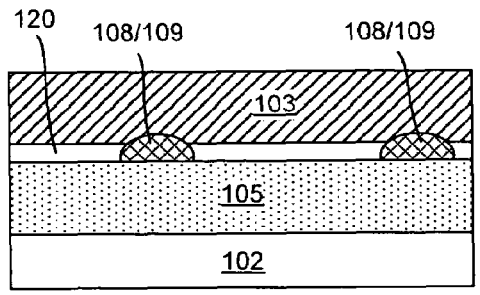
FIG. 23 is a side cutaway view of the semiconductor device of FIG. 20, taken along view C-C' of FIG. 20.
Figure 24:
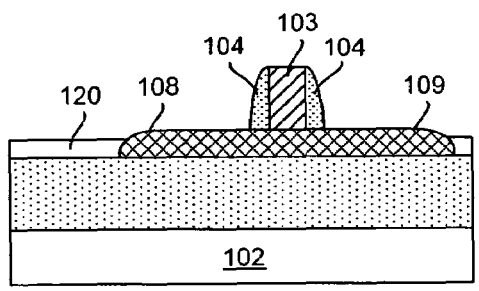
FIG. 24 is a side cutaway view of the semiconductor device of FIG. 20, taken along view D-D' of FIG. 20.

For example, referring to FIGS. 20-24, LOCOS regions 108 and 109 are physically continuous with each other and together completely surround PFET gate 103, including extending underneath PFET gate 103. In this example, parallel slits 2001 and 2002 are formed in the LOCOS regions as shown, on both sides of PFET gate 103. Slits 2001 and 2002 may continuously extend underneath PFET gate 103 (when the slits are formed prior to gate formation) or end at the edge of PFET gate 103 (when the slits are formed after gate formation). Slits 2001 and 2002 may reduce or even completely neutralize any compressive strain in the Y direction (i.e., in the up/down direction of FIG. 20) that would have been provided without slits 2001 and 2002. At the same time, the compressive strain is still maintained in the X direction (i.e., in the left/right direction of FIG. 20). Excessive compressive strain the PFET channel in the Y direction (as indicated in FIG. 20) is undesirable.

Slits 2001 and 2002 may be formed, for example, by creating LOCOS regions 108 and 109 and then removing portions of the LOCOS regions to form the slits. Although slits 2001 and 2002 are shown in this example as being rectangular in cross-sectional profile and linear along their lengthwise axes, they may be of any regular or irregular shape.

Thus, examples have been described as to how semiconductor devices may be manufactured to incorporate LOCOS regions to electrically isolate FET active areas (either alone or in combination with an STI layer) and/or apply appropriate compressive strain on FET channels. This may be particularly useful in SOI regions of a semiconductor device, regardless of whether the semiconductor device also incorporates HOT regions.

What is claimed is:

1. A semiconductor device, comprising:
an insulating layer;
a first silicon layer disposed on the insulating layer;
a P-type field-effect transistor (PFET) disposed in and on the first silicon layer and disposed over the insulating layer;
a second silicon layer; and
an N-type field-effect transistor (NFET) disposed in and on the second silicon layer but not disposed over the insulating layer,
wherein the PFET has a first active area bordered on first and second opposing sides by first and second oxidized silicon regions embedded in the first silicon layer and each extending down to and physically contacting the insulating layer, and the NFET has a second active area bordered on first and second opposing sides by a shallow-trench isolation (STI) layer.

2. The semiconductor device of claim 1, wherein the insulating layer is an oxide layer.

3. The semiconductor device of claim 1, wherein the first active area is bordered on third and fourth opposing sides by the STI layer.

4. The semiconductor device of claim 1, wherein the first and second oxidized silicon regions extend to and border the active area on third and fourth opposing sides of the first active area.

5. The semiconductor device of claim 4, wherein the first and second oxidized silicon regions fully surround the first active area.

6. The semiconductor device of claim 4, wherein the first and second oxidized silicon regions together includes a parallel pair of slits formed lengthwise therein.

7. The semiconductor device of claim 1, further including a third silicon layer, wherein the oxide layer is disposed between the first and second silicon layers and the second silicon layer is disposed on the third silicon layer.

8. A semiconductor device, comprising:
a first insulating layer;
a first silicon layer disposed on the first insulating layer;
a second silicon layer;
a conductive layer having a first portion disposed on the first silicon layer over the first insulating layer and a second portion disposed on the second silicon layer but not over the first insulating layer;
a second insulating layer disposed on the first silicon layer on opposing first and second sides of the first portion of the conductive layer and also on opposing first and second sides of the second portion on of the conductive layer; and
first and second oxidized silicon regions embedded in the first silicon layer and each extending down to and physically contacting the first insulating layer, the first and second oxidized silicon regions each being a continuous region and each including at least a portion not disposed underneath the conductive layer.

9. The semiconductor device of claim 8, wherein the conductive layer is polysilicon.

10. The semiconductor device of claim 8, wherein the first insulating layer is an oxide layer.

11. The semiconductor device of claim 8, wherein the first and second oxidized silicon regions are physically continuous with each other and extend underneath the conductive layer.

12. The semiconductor device of claim 11, wherein the first and second oxidized silicon regions completely encircle a portion of the first silicon layer on which the conductive layer is disposed.

13. A semiconductor device, comprising:
- a first silicon layer;
- an insulating layer disposed on the first silicon layer;
- a second silicon layer disposed on the insulating layer;
- a bulk silicon layer disposed on the first silicon layer but not over the insulating layer;
- a P-type field-effect transistor (PFET) disposed in and on the second silicon layer; and
- an N-type field-effect transistor (NFET) disposed in and on the bulk silicon layer,
- wherein the PFET has a first active area bordered on first and second opposing sides by a pair of local oxidation of silicon (LOCOS) regions extending down to and physically contacting the insulating layer, and the NFET has a second active area bordered by a shallow-trench isolation (STI) layer.

14. The semiconductor device of claim 13, wherein the first active area is further bordered on third and fourth opposing sides by the STI layer.

15. A semiconductor device, comprising:
- a body;
- a P-type field-effect transistor (PFET) disposed in and on the body and having a first active area bordered on first and second opposing sides by a pair of local oxidation of silicon (LOCOS) regions embedded in the body; and
- an N-type field-effect transistor (NFET) disposed in and on the body and having a second active area bordered by a shallow-trench isolation (STI) layer.

16. The semiconductor device of claim 15, wherein the first active area is further bordered on third and fourth opposing sides by the STI layer.

* * * * *